(12) United States Patent
Honda et al.

(10) Patent No.: US 8,557,706 B2
(45) Date of Patent: Oct. 15, 2013

(54) SUBSTRATE PROCESSING METHOD

(75) Inventors: Masanobu Honda, Nirasaki (JP); Hironobu Ichikawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/332,170

(22) Filed: Dec. 20, 2011

(65) Prior Publication Data

US 2012/0094495 A1 Apr. 19, 2012

Related U.S. Application Data

(62) Division of application No. 12/493,667, filed on Jun. 29, 2009, now Pat. No. 8,105,949.

(60) Provisional application No. 61/092,619, filed on Aug. 28, 2008.

(30) Foreign Application Priority Data

Jul. 11, 2008 (JP) ................................ 2008-181729
Feb. 6, 2009 (JP) ................................ 2009-026127

(51) Int. Cl.
*H01L 21/311* (2006.01)

(52) U.S. Cl.
USPC ........... 438/695; 438/694; 438/696; 438/700; 438/701; 438/702; 438/703; 438/733; 438/734; 438/735; 438/736; 438/737; 438/738

(58) Field of Classification Search
USPC .................. 438/694–696, 700–703, 733–738
See application file for complete search history.

(56) References Cited

U.S. PATENT DOCUMENTS

| 4,855,017 | A | 8/1989 | Douglas |
| 5,719,089 | A | 2/1998 | Cherng et al. |
| 6,451,705 | B1 * | 9/2002 | Trapp et al. ................... 438/723 |
| 6,759,340 | B2 | 7/2004 | Nallan et al. |
| 6,890,859 | B1 | 5/2005 | Bamnolker et al. |
| 6,998,348 | B2 | 2/2006 | Ciovacco et al. |
| 7,265,060 | B2 | 9/2007 | Tsai et al. |
| 7,410,906 | B2 | 8/2008 | Araki |
| 7,473,377 | B2 | 1/2009 | Yamaguchi et al. |

(Continued)

FOREIGN PATENT DOCUMENTS

| CN | 1956154 A | 5/2007 |
| JP | 6-151383 | 5/1994 |

(Continued)

OTHER PUBLICATIONS

Chinese Office Action issued Jan. 12, 2011 in Chinese Patent Application No. 200910159324.9 with English translation.
Office Action mailed Mar. 23, 2011, in co-pending U.S. Appl. No. 12/493,667.

*Primary Examiner* — Bac Au
(74) *Attorney, Agent, or Firm* — Oblon, Spivak, McClelland, Maier & Neustadt, L.L.P.

(57) ABSTRACT

A substrate processing method that forms an opening, which has a size that fills the need for downsizing a semiconductor device and is to be transferred to an amorphous carbon film, in a photoresist film of a substrate to be processed. Deposit is accumulated on a side wall surface of the opening in the photoresist film using plasma produced from a deposition gas having a gas attachment coefficient S of 0.1 to 1.0 so as to reduce the opening width of the opening.

9 Claims, 6 Drawing Sheets

(56) References Cited

U.S. PATENT DOCUMENTS

| | | |
|---|---|---|
| 7,541,291 B2 * | 6/2009 | Kang et al. ............... 438/717 |
| 2006/0134917 A1 | 6/2006 | Huang et al. |
| 2006/0141766 A1 | 6/2006 | Kim |
| 2009/0191711 A1 | 7/2009 | Rui et al. |

FOREIGN PATENT DOCUMENTS

| | | |
|---|---|---|
| JP | 2006-190939 | 7/2006 |
| JP | 2006-253245 A | 9/2006 |
| JP | 2008-524851 A | 7/2008 |

* cited by examiner

SUBSTRATE PROCESSING METHOD

CROSS-REFERENCE TO RELATED APPLICATIONS

The present application is a divisional of U.S. application Ser. No. 12/493,667, filed on Jun. 29, 2009, the entire content of which is incorporated herein by reference. U.S. application Ser. No. 12/493,667 claims the benefit of priority under 119(e) of U.S. Provisional Application Ser. No. 61/092,619, filed Aug. 28, 2008, and claims the benefit of priority under 35 U.S.C. 119 from Japanese Application No. 2008-181729 filed Jul. 11, 2008 and Japanese Application No. 2009-026127 filed Feb. 6, 2009.

BACKGROUND OF THE INVENTION

1. Field of the Invention

The present invention relates to a substrate processing method, and in particular to a substrate processing method that carries out processing on a substrate in which a to-be-processed layer, an intermediate layer, and a mask layer are stacked in this order.

2. Description of the Related Art

There has been known a wafer for a semiconductor device in which an oxide film containing impurities such as a TEOS (tetra ethyl ortho silicate) film, a conductive film such as a TiN film, an antireflective film (BARC film), and a photoresist film formed through CVD processing or the like are stacked in this order on a silicon base material (see, for example, Japanese Laid-open Patent Publication (Kokai) No. 2006-190939). The photoresist film is formed to have a predetermined pattern by photolithography and acts as a mask when the antireflective film and the conductive film are etched.

In recent years, as semiconductor devices have become increasingly downsized, a circuit pattern on a surface of the above described wafer has been required to be more finely formed. To form a fine circuit pattern, in the process of manufacturing a semiconductor device, it is necessary to make the minimum size of a pattern in the photoresist film small and form an opening (a via-hole or a trench) of a small size in a to-be-etched film.

However, the minimum size of a pattern in the photoresist film is determined by the minimum size that can be developed using photolithography, but there is a limit to the minimum size that can be mass produced using photolithography due to variations in focal length and so on. For example, the minimum size that can be mass produced using photolithography is about 80 nm. On the other hand, the machining size that fills the need for downsizing a semiconductor device is about 30 nm.

As described above, the required size of a semiconductor device is glowing smaller, and it is thus desired that a technique to form an opening of a size that fills the need for downsizing a semiconductor device in a to-be-etched layer will be developed.

SUMMARY OF THE INVENTION

The present invention provides a substrate processing method that forms an opening, which has a size that fills the need for downsizing a semiconductor device and is to be transferred onto a to-be-etched layer, in a mask film or an intermediate film of a substrate to be processed.

Accordingly, in a first aspect of the present invention, there is provided a substrate processing method that processes a substrate in which a to-be-processed layer, an intermediate layer, and a mask layer are stacked in this order, and in which the mask layer has an opening to which part of the intermediate layer is exposed, comprising an opening width reducing step of accumulating deposit on a side wall surface of the opening in the mask layer using plasma produced from a deposition gas having a gas attachment coefficient S of 0.1 to 1.0, thus reducing an opening width of the opening.

According to the first aspect of the present invention, because there is the opening width reducing step of accumulating deposit on the side wall surface of the opening in the mask layer using plasma produced from the deposition gas having a gas attachment coefficient S of 0.1 to 1.0, thus reducing the opening width of the opening, an opening pattern that is to be transferred to the to-be-etched layer and has an opening of a size that fills the need for downsizing a semiconductor device can be formed in the mask layer.

The first aspect of the present invention can provide a substrate processing method, wherein the deposition gas is represented by a general expression, $C_xH_yF_z$ (x, y, and z are 0 or positive integers).

According to the first aspect of the present invention, because the deposition gas is a gas represented by a general expression, $C_xH_yF_z$ (x, y, and z are 0 or positive integers), deposit with a thickness corresponding to the gas attachment coefficient S can be accumulated on the side wall surface of the opening to reduce the opening width.

The first aspect of the present invention can provide a substrate processing method, wherein the deposition gas is $CHF_3$ gas.

According to the first aspect of the present invention, because the deposition gas is $CHF_3$ gas, deposit can be accumulated on the side wall surface of the opening in the mask layer to reduce the opening width to, for example, about 20 nm.

The first aspect of the present invention can provide a substrate processing method, wherein in the opening width reducing step, bias electrical power of 100 W to 500 W is applied to the substrate.

According to the first aspect of the present invention, because in the opening width reducing step, bias electrical power of 100 W to 500 W is applied to the substrate, deposit can be caused to efficiently become attached to the side wall surface of the opening due to the right amount of bias electrical power.

The first aspect of the present invention can provide a substrate processing method, wherein a processing time in the opening width reducing step is 0.5 minute to 3 minutes.

According to the first aspect of the present invention, because the processing time in the opening width reducing step is 0.5 minute to 3 minutes, the opening width of the opening in the mask layer can be reduced with the minimum necessary processing time.

The first aspect of the present invention can provide a substrate processing method, wherein the opening width reducing step comprises converging the opening width of the opening in the mask layer to a predetermined value corresponding to a value of the gas attachment coefficient S of the deposition gas.

According to the first aspect of the present invention, because in the opening width reducing step, the opening width of the opening in the mask layer is converged to a predetermined value corresponding to a value of the gas attachment coefficient S of the deposition gas, the opening width of the opening can be adjusted to a desired opening width by selecting a deposition gas to be used according to the gas attachment coefficient S.

The first aspect of the present invention can provide a substrate processing method, wherein the opening width reducing step comprises reducing the opening width of the opening in the mask layer, and smoothing out variations in the opening widths of the openings formed in the mask layer to reduce deviations.

According to the first aspect of the present invention, because in the opening width reducing step, the opening width of the opening in the mask layer is reduced, and variations in the opening widths of the openings formed in the mask layer are smoothed out to reduce deviations, variations in opening width which have not conventionally posed any problems can be smoothed out, and the need for downsizing a semiconductor device can be filled.

The first aspect of the present invention can provide a substrate processing method comprising a to-be-processed layer etching step of transferring the opening in the mask layer reduced in opening width in the opening width reducing step onto the to-be-processed layer.

According to the first aspect of the present invention, because there is the to-be-processed layer etching step of transferring the opening in the mask layer reduced in opening width in the opening width reducing step onto the to-be-processed layer, the opening of a size that fills the need for downsizing a semiconductor device can be transferred onto the to-be-processed layer.

Accordingly, in a second aspect of the present invention, there is provided a substrate processing method that processes a substrate in which a to-be-processed layer, an intermediate layer, and a mask layer are stacked in this order, and in which the mask layer has an opening to which part of the intermediate layer is exposed, comprising a shrinking etching step of carrying out the following steps in one step: an opening width reducing step of accumulating deposit on a side wall surface of the opening in the mask layer using plasma produced from a mixed gas of a deposition gas and an anisotropic etching gas, and an etching step of etching the intermediate layer that forms a bottom of the opening.

According to the second aspect of the present invention, because there is the shrinking etching step of carrying out the following steps in one step: the opening width reducing step of accumulating deposit on the side wall surface of the opening in the mask layer using plasma produced from the mixed gas of the deposition gas and the anisotropic etching gas, and an etching step of etching the intermediate layer that forms the bottom of the opening, an opening pattern that is to be transferred to the to-be-processed layer and has an opening of a size that fills the need for downsizing a semiconductor device can be formed in the intermediate layer.

The second aspect of the present invention can provide a substrate processing method, wherein the deposition gas is represented by a general expression, $C_xH_yF_z$ (x, y, and z are 0 or positive integers).

According to the second aspect of the present invention, because the deposition gas is a gas represented by a general expression, $C_xH_yF_z$ (x, y, and z are 0 or positive integers), deposit with a thickness corresponding to the gas attachment coefficient S can be accumulated on the side wall surface of the opening to reduce the opening width.

The second aspect of the present invention can provide a substrate processing method, wherein the deposition gas is $CHF_3$ gas.

According to the second aspect of the present invention, because the deposition gas is $CHF_3$ gas, deposit can be accumulated on the side wall surface of the opening in the mask layer to reduce the opening width to, for example, about 20 nm to 25 nm.

The second aspect of the present invention can provide a substrate processing method, wherein the anisotropic etching gas is a gas that has a higher molecular weight than the deposition gas and contains boron (Br) or a halogen element of a higher atomic number than boron (Br), or sulfur (S) or an element of a higher atomic number than sulfur (S) in the 16th group of the periodic system.

According to the second aspect of the present invention, because the anisotropic etching gas is a gas that has a higher molecular weight than the deposition gas and contains boron (Br) or a halogen element of a higher atomic number than boron (Br), or sulfur (S) or an element of a higher atomic number than sulfur (S) in the 16th group of the periodic system, plasma produced from the anisotropic etching gas can be made to reach the bottom of the opening, and hence, for example, the intermediate film can be etched while suppressing accumulation of deposit on the bottom of the opening.

The second aspect of the present invention can provide a substrate processing method, wherein the anisotropic etching gas is $CF_3I$ gas, $CF_3Br$ gas, HI gas, or HBr gas.

According to the second aspect of the present invention, because the anisotropic etching gas is $CF_3I$ gas, $CF_3Br$ gas, HI gas, or HBr gas, the effect of suppressing accumulation of deposit on the bottom of the opening and the effect of etching the intermediate film can be improved.

The second aspect of the present invention can provide a substrate processing method, wherein a mixing ratio of the deposition gas to the anisotropic etching gas is 6:1 to 1:1.

According to the second aspect of the present invention, because the mixing ratio of the deposition gas to the anisotropic etching gas is 6:1 to 1:1, deposit can be accumulated on the side wall surface of the opening to reduce the opening width, and attachment of deposit to the bottom of the opening can be prevented, so that the intermediate film at the bottom of the opening can be etched.

Accordingly, in a third aspect of the present invention, there is provided a substrate processing method that processes a substrate in which a to-be-processed layer, an intermediate layer, and a mask layer are stacked in this order, and in which the mask layer has an opening to which part of the intermediate layer is exposed, comprising a shrinking etching step of carrying out the following steps in one step: an opening width reducing step of accumulating deposit on a side wall surface of the opening in the mask layer using plasma produced from a mixed gas of an anisotropic etching gas and a hydrogen gas, and an etching step of etching the intermediate layer that forms a bottom of the opening.

According to the third aspect of the present invention, because there is the shrinking etching step of carrying out the following steps in one step: the opening width reducing step of accumulating deposit on the side wall surface of the opening in the mask layer using plasma produced from the mixed gas of the anisotropic etching gas and the hydrogen gas, and the etching step of etching the intermediate layer that forms the bottom of the opening, an opening pattern that is to be transferred to a to-be-etched film and has an opening of a size that fills the need for downsizing a semiconductor device can be formed in the intermediate layer due to a synergistic action of the deposit accumulating action by the gas produced from a reaction of the anisotropic etching gas and the hydrogen gas, and the etching action by the anisotropic etching gas.

The third aspect of the present invention can provide a substrate processing method, wherein the anisotropic etching gas is a gas that contains boron (Br) or a halogen element of a higher atomic number than boron (Br), carbon, and fluorine.

According to the third aspect of the present invention, because the anisotropic etching gas is a gas that contains boron (Br) or a halogen element of a higher atomic number than boron (Br), carbon, and fluorine, plasma produced from the anisotropic etching gas can be made to reach the bottom of the opening, and hence, for example, the intermediate film can be etched while suppressing accumulation of deposit on the bottom of the opening.

The third aspect of the present invention can provide a substrate processing method, wherein the anisotropic etching gas is $CF_3I$ gas or $CF_3Br$ gas.

According to the third aspect of the present invention, the anisotropic etching gas is $CF_3I$ gas or $CF_3Br$ gas, the effect of suppressing accumulation of deposit on the bottom of the opening and the effect of etching the intermediate film can be improved.

The third aspect of the present invention can provide a substrate processing method, wherein a mixing ratio of the anisotropic etching gas to the hydrogen gas in the shrinking etching step is 4:1 to 2:3.

According to the third aspect of the present invention, because the mixing ratio of the anisotropic etching gas to the hydrogen gas in the shrinking etching step is 4:1 to 2:3, the action of accumulating deposit on the side wall of the opening and the action of etching the intermediate film at the bottom of the opening can be balanced, so that the opening width of the opening can be reduced, and the intermediate film at the bottom of the opening can be etched.

The second aspect of the present invention can provide a substrate processing method, wherein in the shrinking etching step, bias electrical power of 100 W to 500 W is applied to the substrate.

According to the second aspect of the present invention, because in the shrinking etching step, bias electrical power of 100 W to 500 W is applied to the substrate, the effect of causing deposit to become attached to the side wall surface of the opening and the effect of etching the intermediate film at the bottom of the opening can be obtained with ease.

The second aspect of the present invention can provide a substrate processing method, wherein in the shrinking etching step, a pressure in a chamber in which the substrate is accommodated is adjusted to 2.6 Pa (20 mTorr) to 2×10 Pa (150 mTorr).

According to the second aspect of the present invention, because in the shrinking etching step, the pressure in the chamber in which the substrate is accommodated is adjusted to 2.6 Pa (20 mTorr) to 2×10 Pa (150 mTorr), the surface of the substrate can be prevented from becoming rough and worn.

The second aspect of the present invention can provide a substrate processing method, wherein the intermediate layer etched in the shrinking etching step consists of two stacked films comprising an antireflective film and a silicon-containing film, or an antireflective film and a metallic film or a silicon-containing organic film stacked below the mask layer.

According to the second aspect of the present invention, because the intermediate layer etched in the shrinking etching step consists of two stacked films comprising the antireflective film and the silicon-containing film, or an antireflective film and a metallic film or a silicon-containing organic film stacked below the mask layer, the opening of a size that fills the need for downsizing a semiconductor device can be formed in the intermediate layer as in the mask layer.

The second aspect of the present invention can provide a substrate processing method comprising a to-be-processed layer etching step of transferring the opening in the intermediate layer corresponding to the opening in the mask layer reduced in opening width in the shrinking etching step onto the to-be-processed layer.

According to the second aspect of the present invention, because there is the to-be-processed layer etching step of transferring the opening in the intermediate layer corresponding to the opening in the mask layer reduced in opening width in the shrinking etching step onto the to-be-processed layer, the opening of a size that fills the need for downsizing a semiconductor device can be transferred to the to-be-processed layer.

The features and advantages of the invention will become more apparent from the following detailed description taken in conjunction with the accompanying drawings.

DETAILED DESCRIPTION OF PREFERRED EMBODIMENTS

The present invention will now be described in detail with reference to the drawings showing preferred embodiments thereof.

First, a description will be given of a substrate processing system that implements a substrate processing method according to embodiments of the present invention. The substrate processing system has a plurality of process modules constructed such as to carry out etching processing, aching processing, or the like using plasma on a semiconductor wafer Q (hereinafter referred to merely as a "wafer Q") as a substrate.

Figure 1:
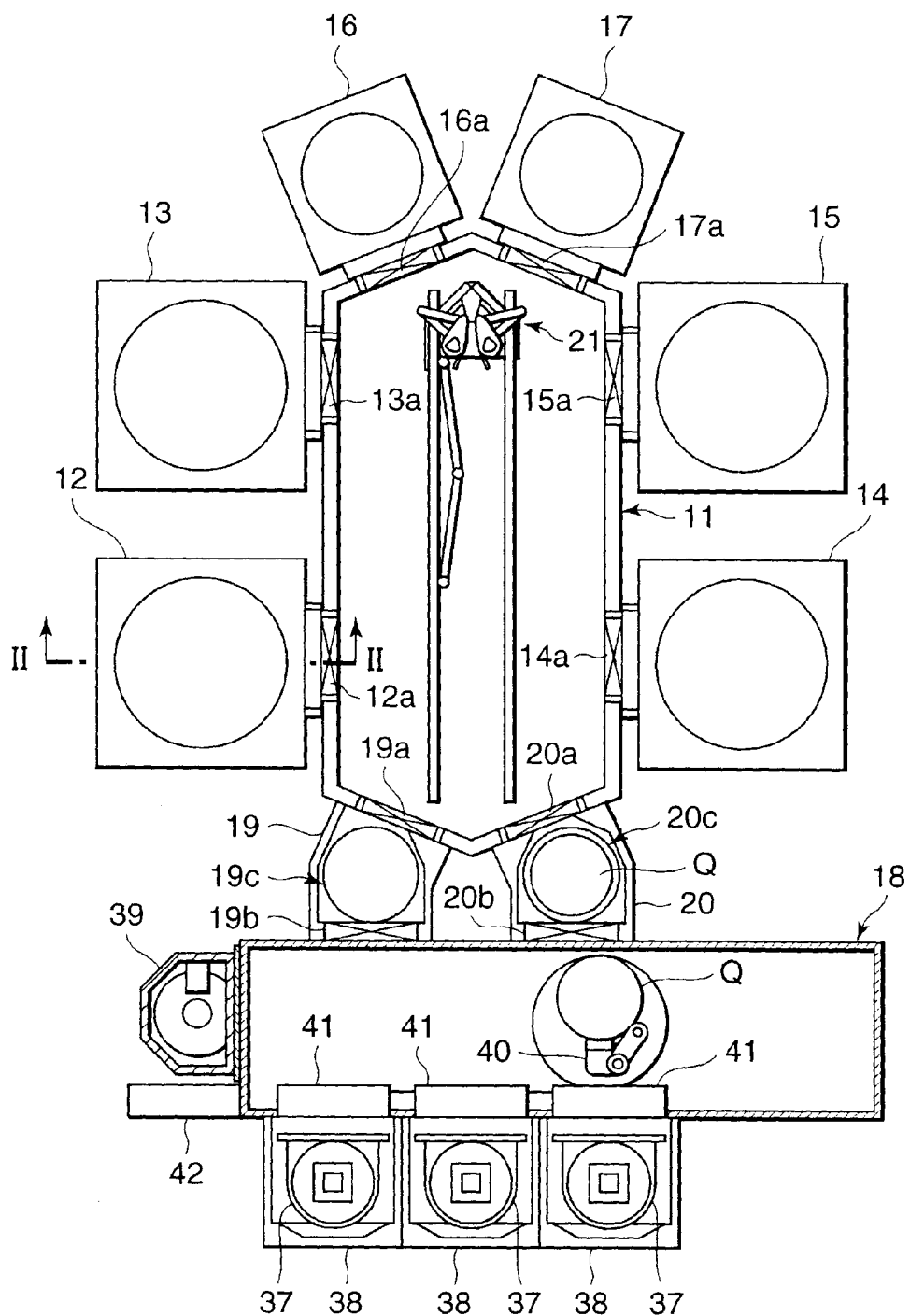
FIG. 1 is a plan view schematically showing the construction of a substrate processing system that implements a substrate processing method according to embodiments of the present invention.

FIG. 1 is a plan view schematically showing the construction of the substrate processing system that implements the substrate processing method according to embodiments of the present invention.

Referring to FIG. 1, the substrate processing system 10 is comprised of a transfer module 11 that is hexagonal in plan view, process modules 12 and 13 connected to a side of the transfer module 11, two process modules 14 and 15 connected to another side of the transfer module 11 such as to face the process modules 12 and 13, a process module 16 that is disposed adjacent to the process module 13 and connected to the transfer module 11, a process module 17 that is disposed adjacent to the process module 15 and connected to the transfer module 11, a loader module 18 as a rectangular transfer chamber, and two load-lock modules 19 and 20 that are disposed between the transfer module 11 and the loader module 18 and connect them together.

The transfer module 11 has therein a transfer arm 21 that is constructed such as to be able to bend, extend, and whirl about a pivot thereof, and the transfer arm 21 transfers wafers Q between the process modules 12 to 17 and the load-lock modules 19 and 20.

The process module 12 has a processing chamber container (chamber) in which a wafer Q is accommodated. A CF-based deposition gas, for example, a mixed gas of $CHF_3$ gas and halogen-based gas, for example, HBr gas is introduced as a process gas into the chamber to produce an electric field in the chamber, so that the introduced process gas is turned into plasma, and the wafer Q is subjected to etching processing by the plasma.

Figure 2:
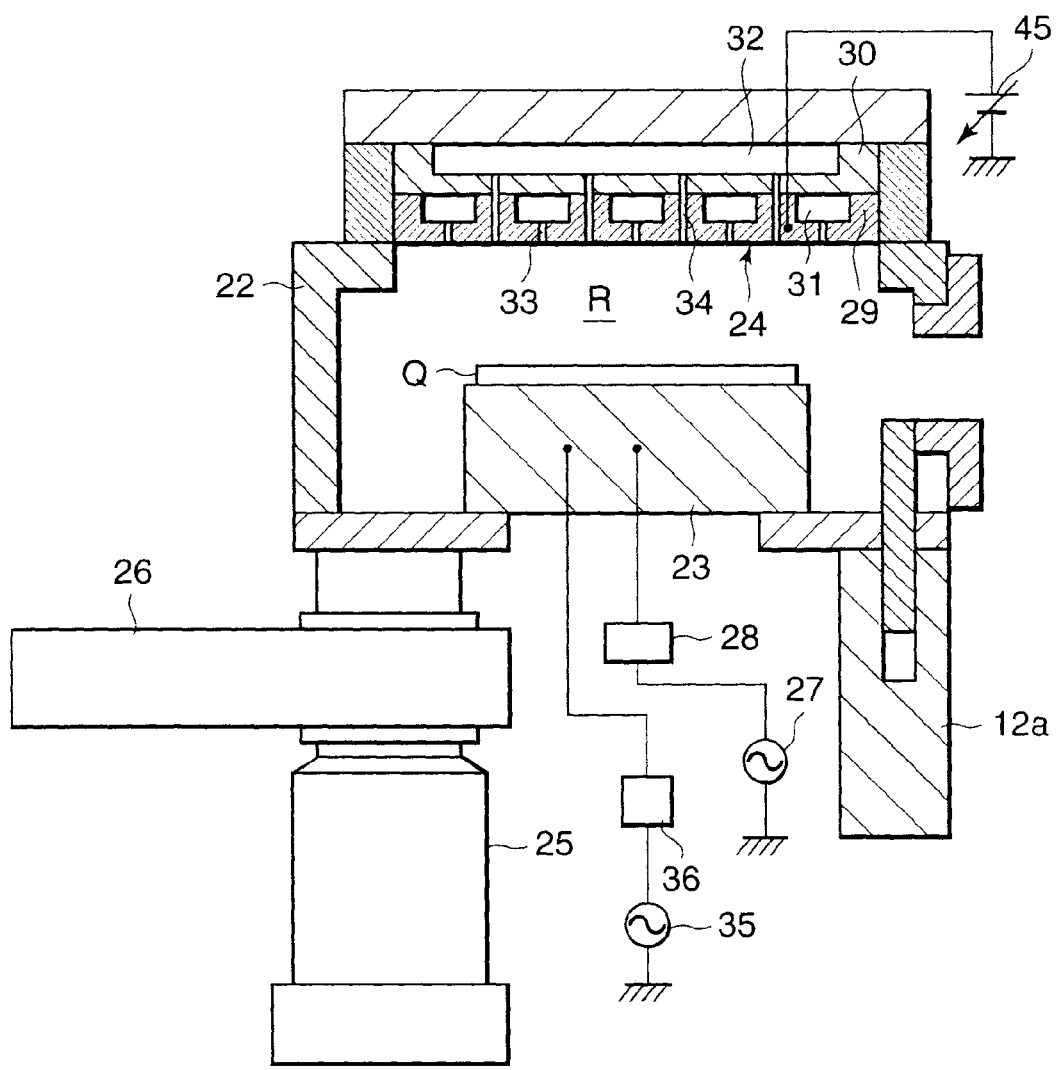
FIG. 2 is a cross-sectional view taken along line II-II in FIG. 1.

FIG. 2 is a cross-sectional view taken along line II-II in FIG. 1.

Referring to FIG. 2, the process module 12 has a processing chamber (chamber) 22, a mounting stage 23 that is disposed in the chamber 22 and on which a wafer Q is mounted, and a showerhead 24 that is disposed in a upper portion of the chamber 22 such as to face the mounting stage 23, a TMP (turbo-molecular pump) 25 that exhausts gas or the like in the chamber 22, and an APC (adaptive pressure control) valve 26 that is disposed between the chamber 22 and the TMP 25 and acts as a variable butterfly valve that controls the pressure in the chamber 22.

A first radio frequency power source 27 and a second radio frequency power source 35 are connected to the mounting stage 23 via a first matcher 28 and a second matcher 36, respectively. The first radio frequency power source 27 applies radio frequency electrical power of a relatively high frequency, for example, 60 MHz as excitation electrical power to the mounting stage 23, and the second radio frequency power source 35 applies radio frequency electrical power of a relatively low frequency, for example, 2 MHz as a bias to the mounting stage 23. The mounting stage 23 thus acts as a lower electrode that applies radio frequency electrical power to a processing space R between the mounting stage 23 and the showerhead 24. The matchers 28 and 36 reduce the reflection of radio frequency electrical power from the mounting stage 23, thereby maximizing the efficiency of supply of the radio frequency electrical power to the mounting stage 23.

Also, the showerhead 24 is comprised of a disk-shaped lower layer gas supply unit 29 and a disk-shaped upper layer gas supply unit 30, and the upper layer gas supply unit 30 is overlaid on the lower layer gas supply unit 29. The lower layer gas supply unit 29 and the upper layer gas supply unit 30 have a first buffer chamber 31 and a second buffer chamber 32, respectively. The first buffer chamber 31 and the second buffer chamber 32 communicate with the interior of the chamber 22 via gas vent holes 33 and 34, respectively.

The first buffer chamber 31 is connected to, for example, a $CHF_3$ gas supply system (not shown). The $CHF_3$ gas supply system supplies $CHF_3$ gas to the first buffer chamber 31. The supplied $CHF_3$ gas is supplied to the interior of the chamber 22 via the gas vent holes 33. The second buffer chamber 32 is connected to, for example, an HBr gas supply system (not shown). The HBr gas supply system supplies HBr gas to the second buffer chamber 32. The supplied HBr gas is supplied to the interior of the chamber 22 via the gas vent holes 34. A DC power source 45 is connected to the showerhead 24. The DC power source 45 applies a DC voltage to the showerhead 24. The applied DC voltage controls the distribution of ions in the processing space R.

In the chamber 22 of the process module 12, through the mounting stage 23 applying radio frequency electrical power into the processing space R as described above, the process gas supplied from the showerhead 24 into the processing spaces R is turned into high-density plasma so that ions and radicals are produced, whereby the wafer Q is subjected to the etching processing by the ions and radicals.

Referring again to FIG. 1, the process module 13 has a processing chamber (chamber) in which the wafer Q having been subjected to the etching processing in the process module 12 is accommodated. A mixed gas of $O_2$ gas and $N_2$ gas is introduced as a process gas into the chamber to produce an electric field in the chamber, so that the introduced process gas is turned into plasma, and the wafer Q is subjected to the etching processing by the plasma. It should be noted that the process module 13 is similar to the process module 12 in terms of construction, and has, for example, an $O_2$ gas supply system and an $N_2$ gas supply system (both not shown) in place of the $CHF_3$ gas supply system and the HBr gas supply system. It should be noted that the etching processing in the process module 13 may double as the ashing processing.

The process module 14 has a processing chamber (chamber) in which the wafer Q having been subjected to the etching processing in the process module 13 is accommodated. $O_2$ gas is introduced as a process gas into the chamber to produce an electric field in the chamber, so that the introduced process gas is turned into plasma, and the wafer Q is subjected to the ashing processing by the plasma. It should be noted that the process module 14 as well is similar to the process module 12 in terms of construction, and has a showerhead comprised only of a disk-shaped gas supply unit whose $O_2$ gas supply system connected to a buffer chamber (all of them not shown) in place of the showerhead 24 comprised of the disk-shaped lower layer gas supply unit 29 and the disk-shaped upper layer gas supply unit 30.

The interiors of the transfer module 11 and the process modules 12 to 17 are maintained in an evacuated state, and the transfer module 11 and the process modules 12 to 17 are connected together via respective vacuum gate valves 12a to 17a.

In the substrate processing system 10, the interior of the loader module 18 is maintained at atmospheric pressure, and on the other hand, the interior of the transfer module 11 is maintained in a vacuum. Thus, the load-lock modules 19 and 20 have respective vacuum gate valves 19a and 20a at locations joined to the transfer module 11, and have respective atmospheric door valves 19b and 20b at locations joined to the loader module 18, so that each of the load-lock modules 19 and 20 acts as a vacuum preliminary transfer chamber of which inner pressure is adjustable. The load-lock modules 19 and 20 also have respective wafer mounting stages 19c and 20c on which a wafer Q transferred between the loader module 18 and the transfer module 11 is temporarily mounted.

To the loader module 18 are connected three FOUP (front opening unified pod) mounting stages 38 on each of which a FOUP 37 as a container in which, for example, 25 wafers Q are accommodated is mounted, and an orienter 39 that prealigns the position of a wafer Q transferred out from the FOUP 37.

The load-lock modules 19 and 20 are connected to a side wall of the loader module 18 in the longitudinal direction thereof and disposed such as to face the three FOUP mounting stages 38 with the loader module 18 interposed therebetween. The orienter 39 is disposed at one end of the loader module 18 in the longitudinal direction thereof.

The loader module 18 has therein a SCARA-type dual-arm transfer arm 40 for transferring wafers Q, and has on a side wall thereof three load ports 41 that are disposed correspondingly to the respective FOUP mounting stages 38 and through which wafers Q are transferred. The transfer arm 40 removes each wafer Q from the FOUPs 37 mounted on the FOUP mounting stages 38 via the load ports 41 and transfers the removed wafer Q into and from the load-lock modules 19 and 20 and the orienter 39.

Moreover, the substrate processing system 10 has an operation panel 42 disposed at one end of the loader module 18 in the longitudinal direction thereof. The operation panel 42 has a display unit comprised of, for example, an LCD (liquid crystal display), and the display unit displays operating states of the component elements of the substrate processing system 10.

Figure 3:
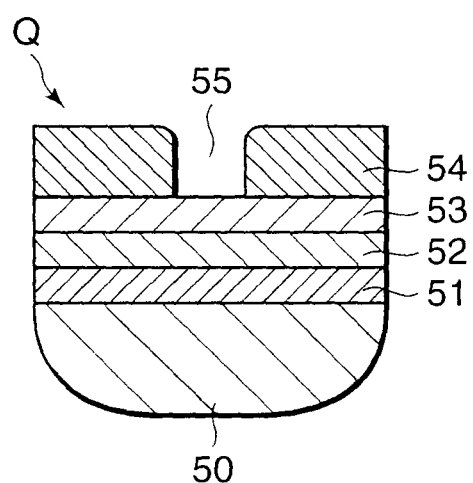
FIG. 3 is a cross-sectional view schematically showing the construction of a semiconductor wafer subjected to plasma processing in the substrate processing system shown in FIG. 1.

FIG. 3 is a cross-sectional view schematically showing the construction of a semiconductor wafer subjected to the plasma processing in the substrate processing system shown in FIG. 1.

Referring to FIG. 3, a wafer Q has an amorphous carbon film (lower layer resist film) 51 as a to-be-processed layer which is formed on a surface of a silicon base material 50, an SiON film (hard mask) 52 formed on the amorphous carbon film 51, an antireflective film (BARC film) 53 formed on the SiON film 52, and a photoresist film 54 (mask layer) formed on the antireflective film 53.

The silicon base material 50 is a disk-shaped thin sheet made of silicon. The amorphous carbon film 51 is formed on the surface of the silicon base material 50 by carrying out, for example, CVD processing. The amorphous carbon film 51 acts as a lower layer resist film. The SiON film 52 is formed on a surface of the amorphous carbon film 51 by carrying out CVD processing, PVD processing, or the like. The antireflective film 53 is formed on the SiON film 52 by carrying out, for example, coating processing. The antireflective film 53 is made of high polymer resin including coloring matter that absorbs light of a specific wavelength, for example, ArF excimer laser light irradiated toward the photoresist film 54, and prevents the ArF excimer laser light having passed through the photoresist film 54 from being reflected by the SiON film 52 and reaching the photoresist film 54 again. The photoresist film 54 is formed on the antireflective film 53 using, for example, a spin coater (not shown). The photoresist film 54 is made of positive type photosensitive resin and changes in quality to become alkaline soluble when irradiated with the ArF excimer laser light.

The ArF excimer laser light corresponding to a pattern inverted into a predetermined pattern is irradiated onto the photoresist film 54 of the wafer Q constructed as described above by a stepper (not shown), and a portion of the photoresist film 54 irradiated with the ArF excimer laser light changes in quality to become alkaline soluble. Thereafter, a strong alkaline developing agent is dropped onto the photoresist film 54 to remove the portion that has changed in quality to become alkaline soluble. Thus, the portion corresponding to the pattern inverted into the predetermined pattern is removed from the photoresist film 54, and hence the photoresist film 54 having a predetermined pattern, for example, having an opening 55 at a position at which a via-hole is to be formed remains on the wafer Q.

To fill the need for downsizing a semiconductor device, an opening (e.g. a via-hole or a trench) of a small dimension, specifically, having a width (CD (critical dimension) value) of about 25 nm to 30 nm has to be formed in a to-be-etched film. However, because the minimum possible size for mass production in photolithography is, for example, about 80 nm, it has been difficult to form an opening with an opening width that fills the need for downsizing a semiconductor device in a to-be-etched film through the etching processing of the wafer Q.

To find a method of forming an opening having an opening width that fills the need for downsizing a semiconductor device as described above, the present inventors carried out various experiments. As a result, the present inventors found that when the wafer Q constructed such that the amorphous carbon film 51 as a to-be-processed layer, the SiON film 52 as a hard coat layer, the antireflective film (BARC film) 53, and the photoresist film 54 having the opening 55 to which the antireflective film 53 is exposed are stacked in this order on the silicon base material 50 is subjected to the plasma processing using CF-based deposition gas ($C_xH_yF_z$; x, y, and z are 0 or positive integers) having a specific gas attachment coefficient S, deposit accumulates on a side wall surface of the opening 55 provided in the photoresist film 54, and as a result, the opening width decreases (shrinks).

Then, based on the above findings, the present inventors then formed the hypothesis that the opening width of the photoresist film after the shrinking processing finally converges to a predetermined width in dependence on the type of a deposition gas i.e. the gas attachment coefficient S applied to the plasma processing, and the opening width having converged to the predetermined width fills the need for downsizing a semiconductor device, and conducted various studies on the type of a deposition gas, gas attachment coefficient, processing conditions, processing time, and so on based on the above hypothesis. As a result, the present inventors found that by carrying out the plasma processing using a CF-based deposition gas, for example, $CFH_3$ gas with a gas attachment coefficient S of 0.1 to 1.0, a wafer Q having a photoresist film with an opening having a target opening width of, for example, 25 nm to 30 nm can be obtained, and arrived at the present invention.

A description will now be given of a substrate processing method according to a first embodiment of the present invention.

This substrate processing method is a method in which the opening width of the opening 55 formed in the photoresist film 54 of the wafer Q is reduced by attaching deposit arising from the plasma processing to the side wall surface of the opening 55, and has an opening width reducing step, an etching step of transferring a pattern of the opening 55 whose opening width has been reduced onto the amorphous carbon film 51 as a to-be-processed layer, and so on, and is thus called a two-step approach, for example.

FIGS. 4A, 4B, 4C, 4D, 4E, 4F, and 4G are process diagrams of the substrate processing method according to the first embodiment of the present invention.

Figure 4A:
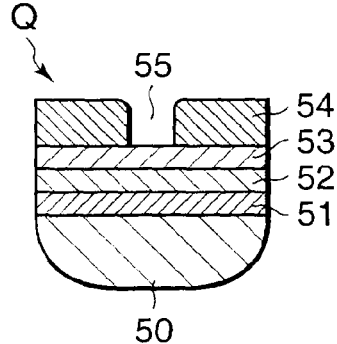
FIGS. 4A, 4B, 4C, 4D, 4E, 4F, and 4G are process diagrams of a substrate processing method according to a first embodiment of the present invention.

Referring to FIGS. 4A, 4B, 4C, 4D, 4E, 4F, and 4G, first, a wafer Q in which the amorphous carbon film 51 as a lower layer resist film, the SiON film 52 as a hard mask, the antireflective film (BARC film) 53, and the photoresist film 54 are stacked in this order on the silicon base material 50, and the photoresist film 54 has the opening 55 to which part of the antireflective film 53 is exposed with an opening width of, for example, 60 nm is prepared (FIG. 4A). Then, the wafer Q is transferred into the chamber 22 of the process module 12 (see FIG. 2) and mounted on the mounting stage 23.

Figure 4B:
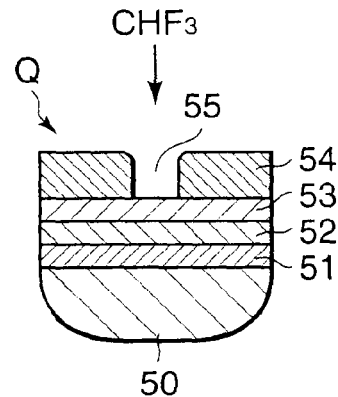
Figure 4C:
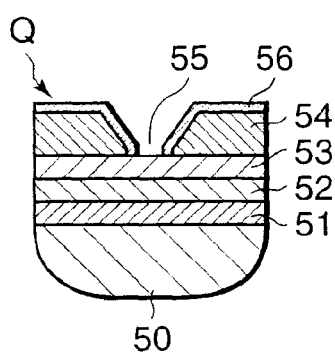

Next, the pressure in the chamber 22 is set to, for example, 1×10 Pa (75 mTorr) by the APC valve 26 or the like. Also, the temperature of the wafer Q is set to, for example, 50° C. Then, $CHF_3$ gas is supplied at a flow rate of, for example, 300 sccm from the lower layer gas supply unit 29 of the showerhead 24 into the chamber 22. Then, excitation electrical power of 750 W and bias electrical power of 300 W are supplied to the mounting stage 23, and a DC voltage of 300 V is applied to the showerhead 24. At this time, the CHF$_3$ gas is excited by radio frequency electrical power applied into the processing space R and turns into plasma, so that ions and radicals are produced (FIG. 4B). These ions and radicals collide and react with a surface or a side wall surface of the opening 55 in the photoresist film 54, causing deposit 56 to accumulate on that portion (FIG. 4C).

The thickness of the deposit 56 gradually increases from the start of the processing and reaches, for example, 35 nm (opening width: 25 nm) three minutes after the start of the processing. Through this opening width reducing step (hereinafter sometimes referred to as the "shrinking step"), the opening width of the opening 55 can be reduced from 60 nm to 25 nm.

From a theoretical formula, it is derived that the accumulation speed of the deposit 56 accumulating on the side wall surface of the opening 55 at this time is proportional to the opening width W of the opening 55. Specifically, the accumulation speed of the deposit 56 accumulating on the side wall surface of the opening 55 is expressed by the following theoretical formula:

$$GrowthRate(z) \propto s \cdot \frac{\cosh\left(\phi \cdot \frac{z}{L}\right) + \frac{\phi \cdot W}{2L}\sinh\left(\phi \cdot \frac{z}{L}\right)}{\cosh(\phi) + \frac{\phi \cdot W}{2L}\sinh(\phi)} \quad \text{[Formula 1]}$$

$$\phi = L \cdot \sqrt{\frac{v_t}{W} \cdot \frac{s}{D}}, \quad D = \frac{1}{3} \cdot v_t \cdot W$$

where S is a gas attachment coefficient, z is a distance from the bottom of the opening, W is an opening width, and L is a height (depth) of the opening.

It is clear from the above theoretical formula that the accumulation speed of the deposit 56 accumulating on the side wall surface of the opening 55 depends on the opening width W of the opening 55. Specifically, if the gas attachment coefficient is the same, the larger the opening width W is, the higher is the accumulation speed of the deposit 56, and the smaller the opening width W is, the lower is the accumulation speed of the deposit 56. Moreover, if the gas attachment coefficient is the same, the larger the opening width W is, the larger is the deposit attachment thickness, and the smaller the opening width W is, the smaller is the deposit attachment thickness. The opening width of the opening 55 after the attachment of deposit converges to a predetermined width in dependence on the type of deposition gas, that is, the gas attachment coefficient with the passage of processing time, and the shrink rate of a portion whose initial opening width is large is higher than the shrink rate of a portion whose initial opening width is small. Thus, to obtain a target opening width, it is effective to use a deposition gas having a gas attachment coefficient that can achieve the target opening width.

Here, the deposition gas means a gas that has the property of causing the deposit 56 to accumulate on the side wall surface of the opening 55 in the photoresist film 54 as a mask layer to reduce the opening width of the opening 55 through the plasma processing using the gas. The CHF$_3$ gas has a gas attachment coefficient S of, for example, 0.5, and converges the opening width to, for example, 20 nm to 50 nm.

Then, the etching processing in which the opening formed in the photoresist film 54 under the normal conditions is transferred onto the amorphous carbon film 54 as a to-be-processed layer is carried out on the wafer Q having the photoresist film 54 with the opening 55 whose opening width has been reduced to 25 nm.

Figure 4D:
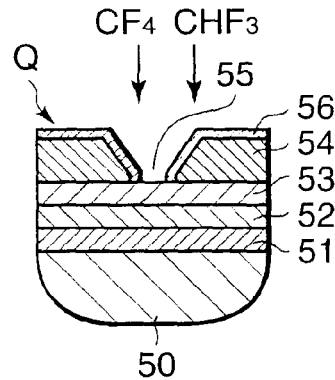
Figure 4E:
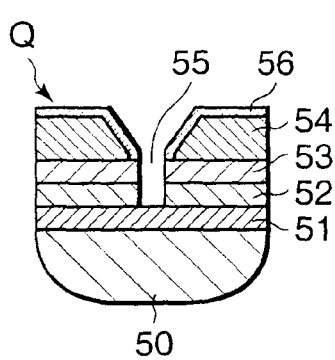

Specifically, the pressure in the chamber 22 in which the wafer Q having the photoresist film 54 with the opening 55 whose opening width has been reduced to 25 nm is accommodated is set to, for example, 1×10 Pa (75 mTorr) by the APC valve 26 or the like, and the temperature of the wafer Q is set to, for example, 50°. Then, CF$_4$ gas is supplied at a flow rate of, for example, 220 sccm from the lower layer gas supply unit 29 of the showerhead 24 into the chamber 22, and CHF$_3$ gas is supplied at a flow rate of, for example, 250 sccm from the upper layer gas supply unit 30 into the chamber 22. Then, excitation electrical power of 750 W and bias electrical power of 0 W are supplied to the mounting stage 23, and a DC voltage of 300 V is applied to the showerhead 24. At this time, the CF$_4$ gas and the CHF$_3$ gas are caused to turn into plasma by radio frequency electrical power applied into the processing space R, so that ions and radicals are produced. These ions and radicals collide and react with a portion of the antireflective film 53 which is not covered with the photoresist film 54, and etch the concerned portions of the antireflective film 53 and the SiON layer 52 under the antireflective film 53 (FIG. 4D). The concerned portions of the antireflective film 53 and the SiON layer 52 are etched until the amorphous carbon film 51 exposes itself (FIG. 4E).

The wafer Q in which the opening width of the opening 55 in the photoresist film 54 has been reduced, and the antireflective film 53 and SiON layer 52 have been etched in the above described manner is transferred out from the chamber 22 of the process module 12, transferred into the chamber of the process module 13 via the transfer module 11, and mounted on the mounting stage.

Figure 4F:
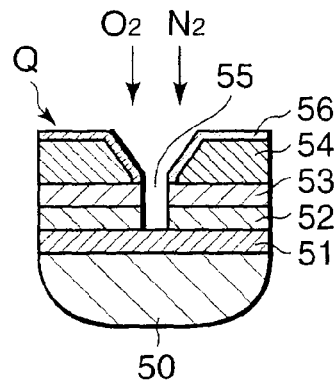
Figure 4G:
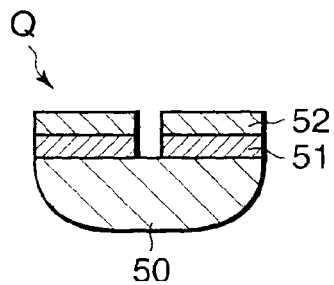

Then, the pressure in the chamber is set to 2.6 Pa (20 mTorr) by the APC valve or the like. Then, O$_2$ gas is supplied at a flow rate of, for example, 180 sccm from the lower layer gas supply unit of the showerhead into the chamber, and N$_2$ gas is supplied at a flow rate of, for example, 20 sccm from the upper layer gas supply unit into the chamber. Then, excitation electrical power of 1000 W is supplied to the mounting stage, and bias electrical power is set to 0 W. At this time, the O$_2$ gas and the N$_2$ gas are caused to turn into plasma by radio frequency electrical power applied into the processing space R, so that ions and radicals are produced. These ions and radicals collide and react with a portion of the amorphous carbon film 51 which is not covered with the photoresist film 54, the deposit 56 accumulated on the side wall surface of the opening 55 in the photoresist film 54, the antireflective film 53, and the SiON layer 52, and etch that portion (FIG. 4F). The amorphous carbon film 51 in that portion is etched until the silicon base material 50 exposes itself, and as a result, an opening with a width of 25 nm is formed in the amorphous carbon film 51. At this time, the photoresist film 54, the deposit 56 accumulated on the side wall and the upper surface of the opening 55 in the photoresist film 54, and the antireflective film 53 are removed at the same time (FIG. 4G).

After that, the wafer Q is transferred out from the chamber of the process module 13, followed by terminating the present process.

In this case, the shrinking step of accumulating the deposit 56 on the inner wall surface of the opening 55 in the photoresist film 54, and the etching step of transferring the opening width of the opening 55 in the photoresist film 54 reduced by the shrinking step and transferred to the antireflective film 53 and the SiON layer 52 to the amorphous carbon film 51 may be carried out successively in the same chamber.

According to the present embodiment, by carrying out the plasma processing using deposition gas with a gas attachment coefficient S of 0.1 to 1.0, the deposit 56 can be accumulated on the side wall surface of the opening 55 in the photoresist film 54 to reduce the opening width thereof. If the deposit 56 is accumulated on the side wall surface of the opening 55 in the photoresist film 54 to adjust the opening width from 60 nm to, for example, 25 nm, an opening with a width of 25 nm can be formed accordingly in the amorphous carbon film 51 as a to-be-processed layer. Thus, an opening in a size that fills the need for downsizing a semiconductor device can be formed in the amorphous carbon film 51 as a to-be-processed layer.

In the present embodiment, the deposition gas is represented by a general expression, $C_xH_yF_z$ (x, y, and z are 0 or positive integers) and has a gas attachment coefficient S of 0.1 to 1.0, preferably, 0.1 to 0.5. $CHF_3$ gas has a gas attachment coefficient S of about 0.5, and converges the opening width to, for example, 20 nm to 25 nm. Not only $CHF_3$ gas but also $CH_2F_2$ gas, $CH_3F$ gas, $C_5F_8$ gas, $C_4F_6$ gas, $CF_4$ gas, $CH_4$ gas, or the like may be used as the deposition gas. These deposition gases as well can fill the recent need for downsizing a semiconductor device and reduce/converge the opening width of the opening 55 formed in the photoresist film 54 of the wafer Q to, for example, 25 nm to 30 nm in the shrinking step.

In the present embodiment, it is preferred that the bias electrical power during the etching processing is 100 W to 500 W. If the bias electrical power is less than 100 W, the amount of deposit attached to the side wall surface of the opening is insufficient. On the other hand, if the bias electrical power is more than 500 W, the photoresist film 54 becomes rough due to sputtering. If the bias electrical power is 100 W to 500 W, the deposition gas can be prevented from scattering, and hence the deposit 56 with a uniform thickness can be accumulated on the side wall surface of the opening 55 to reduce the opening width. The processing temperature is not particularly limited and is usually 20° C. to 100° C., but preferably room temperature In the present embodiment, the etching processing time is 0.5 minute to 3 minutes. This is because the deposit attachment speed is the highest at the start of etching and then gradually decreases to become substantially 0 three minutes later, and the opening width converges to a predetermined width. Thus, the thickness of deposit may be controlled by controlling the processing time.

In the present embodiment, an Si-ARC film with an antireflective function which is formed by containing several dozen % of silicon (Si) in BARC of an organic film may be used in place of the SiON film 52 as a hard mask and the antireflective film (BARC film) 53 comprised of an organic film.

Moreover, although in the wafer Q to which the substrate processing method according to the present embodiment is applied, the to-be-processed layer is the amorphous carbon layer 51, the to-be-processed layer is not limited to this, but may be an $SiO_2$ film, TiN film, or the like.

In the present embodiment, the deposit 56 becomes attached to an opening with a large opening width at a high speed, and the deposit 56 becomes attached to an opening with a small opening width at a low speed, and thus, using the characteristics that the opening width after the attachment of deposit converges to a predetermined value specific to applied gas if the deposit attachment time is relatively long, for example, three minutes, variations in the opening widths of the openings 55 in the photoresist film 54 which vary at the start of etching can be smoothed out to be made uniform.

Next, a description will now be given of variations for clarifying the effect of smoothing out variations in opening widths according to the present embodiment.

In a variation 1, when plasma etching processing was carried out on a wafer Q for three minutes on the same conditions as those in the above described embodiment except that the initial opening width of the opening 55 in the photoresist film 54 was 65 nm, the thickness of the deposit 56 reached 38 nm (opening width: 27 nm) three minutes after the start of the processing. As a result of the processing, the opening width could be reduced from 65 nm to 27 nm.

Next, in a variation 2, when plasma etching processing was carried out on a wafer Q for three minutes on the same conditions as those in the above described embodiment except that the initial opening width of the opening 55 in the photoresist film 54 was 70 nm, the thickness of the deposit 56 reached 42 nm (opening width: 28 nm) three minutes after the start of the processing. As a result of the processing, the opening width could be reduced from 70 nm to 28 nm.

In the present embodiment and the variations 1 and 2, the initial opening widths of the opening 55 in the photoresist film 54 in the wafer Q were 60 nm, 65 nm, and 70 nm, respectively, but the opening widths of the opening 55 in the photoresist film 54 were 25 nm, 27 nm, and 28 nm, respectively, after the plasma etching processing using $CHF_3$ gas. It is thus clear that the plasma etching processing using $CHF_3$ gas as a deposition gas has not only the shrinking effect of reducing the opening width but also the effect of reducing the opening widths (60 nm to 70 nm), which vary in an initial stage (±5 nm: 60 nm on average), to target opening widths, for example, close to 27 nm and also smoothing out variations in initial opening widths (variations of ±2 nm after the processing).

Example 1

When a wafer Q in which intermediate layer and a photoresist film having an opening with an opening width of 60 nm are provided on a silicon base material was prepared, the pressure in the chamber was set to 1×10 Pa (75 mTorr), the temperature of the wafer Q was set to 50° C., $CHF_3$ gas was supplied as a deposition gas into the chamber at a flow rate of 300 sccm, bias electrical power of 300 W was supplied to produce plasma, and shrinking processing was carried out in which the opening in the photoresist film was reduced, the thickness of deposit was 31 nm (opening width: 29 nm) 0.5 minute after the start of the processing, the thickness of deposit was 32 nm (opening width: 28 nm) 1 minute after the start of the processing, and the thickness of deposit was 33 nm (opening width: 27 nm) 3 minutes after the start of the processing.

It is clear from this result that the effect of reducing the opening width of the opening in the photoresist film in the shrinking processing reaches a peak about 0.5 minute after the start of the processing and roughly converges three minutes after the start of the processing. It is thus preferred that the processing time is 0.5 minute to 3.0 minutes.

Next, a detailed description will now be given of a second embodiment of the present invention.

The present inventors found that if the shrinking processing is carried out so as to reduce the opening width of an opening provided in a photoresist film of a wafer Q, deposit accumulates on not only a side wall surface of the opening but also a bottom of the opening, and the thickness of the deposit accumulated on the bottom increases with the thickness of the deposit accumulated on the side wall, and hence the thickness of the deposit accumulated on the bottom varies with initial opening widths, and if the thickness of deposit on the bottom of the opening differs, deposit accumulated on the bottom cannot be punched in the same manner even if the same etching processing is carried out, and this inhibits uniform processing.

Then, based on the above findings, the present inventors made various studies and found that if plasma processing is carried out using a deposition gas that tends to accumulate deposit on the side wall surface of the opening, and an anisotropic etching gas that etches the bottom of the opening to suppress accumulation of deposit on the bottom of the opening, the opening width of the opening in the photoresist film can be reduced, and accumulation of deposit on the bottom of the opening can be prevented.

Figure 5A:
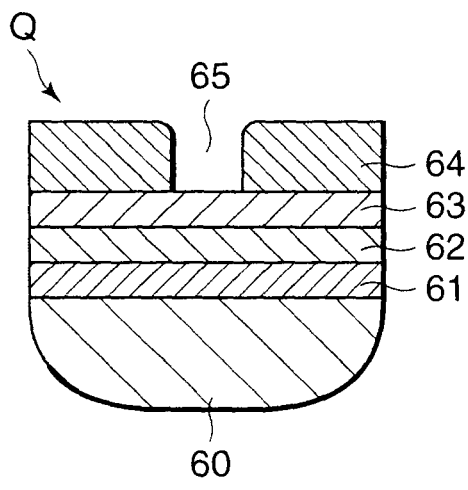
FIGS. 5A, 5B, and 5C are process diagrams of a substrate processing method according to a second embodiment of the present invention.
Figure 5B:
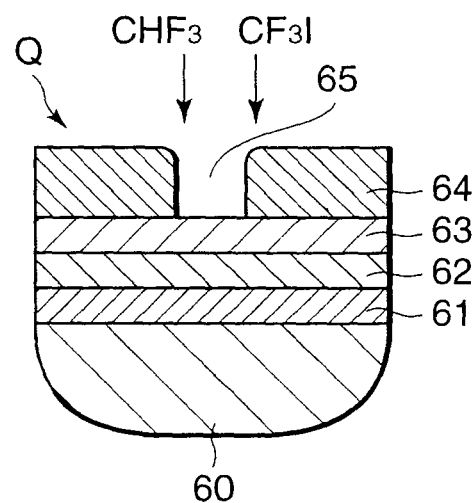
Figure 5C:
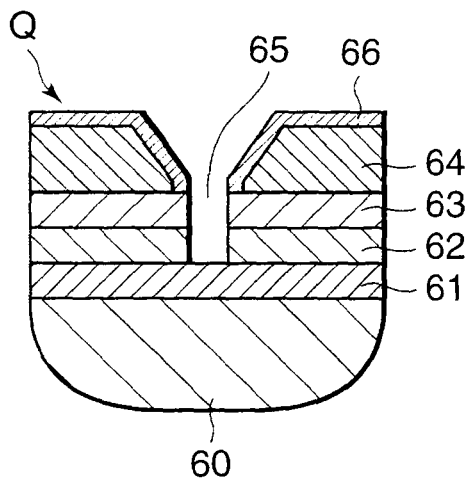

FIGS. 5A, 5B, and 5C are process diagrams of a substrate processing method according to the second embodiment of the present invention.

Referring to FIGS. 5A, 5B, and 5C, first, a wafer Q in which a lower layer resist film 61 made of amorphous carbon, an SiON film 62 as a hard mask, an antireflective film (BARC film) 63, and a photoresist film 64 are stacked in this order on a silicon base material 60, and the photoresist film 64 has an opening 65 to which part of the antireflective film 63 is exposed with an opening width of, for example, 60 nm is prepared (FIG. 5A). Then, the wafer Q is transferred into the chamber 22 of the process module 12 (see FIG. 2) and mounted on the mounting stage 23.

Next, the pressure in the chamber 22 is set to, for example, $2\times10$ Pa (150 mTorr) by the APC valve 26 or the like. Also, the temperature of the wafer Q is set to, for example, 50° C. Then, $CHF_3$ gas is supplied at a flow rate of, for example, 300 sccm from the lower layer gas supply unit 29 of the showerhead 24 into the chamber 22, and $CF_3I$ gas is supplied at a flow rate of, for example, 200 sccm from the upper layer gas supply unit 30 into the chamber 22. At this time, the flow ratio of the $CHF_3$ gas and the $CF_3I$ gas is 3:2. Then, radio frequency electrical power of 750 W as excitation electrical power and radio frequency electrical power of 300 W as bias electrical power are supplied to the mounting stage 23. Moreover, a DC voltage of 300 V is applied to the showerhead 24.

At this time, the $CHF_3$ gas and the $CF_3I$ gas are excited by radio frequency electrical power applied into the processing space R and turn into plasma, so that ions and radicals are produced (FIG. 5B). The ions and radicals produced from the $CHF_3$ gas collide and react with a surface or a side wall surface of the opening 65 in the photoresist film 64, causing deposit 66 to accumulate on that portion to reduce the opening width. At this time, the deposit 66 tends to accumulate on a bottom of the opening 65 as well. On the other hand, the ions and radicals produced from the $CF_3I$ gas are unlikely to laterally diffuse in the opening 65 and thus do not collide with the deposit accumulated on the side wall surface of the opening 65 but go toward the bottom of the opening 65 to collide with the deposit accumulated on the bottom of the opening 65 and remove the deposit and further etch the antireflective film 63 and the SiON film 62 as underlayers. That is, the ions and radicals produced from the $CF_3I$ gas collaborate with the ions and radicals produced from the $CHF_3$ gas to etch the bottom of the opening 65 which is not covered with the photoresist film 64 and the deposit 66 accumulated on the opening 65 in the photoresist film 64 while shrinking the opening width of the opening 65 (FIG. 5C) (shrinking etching step).

At this time, the diameters of the opening 65 at its entrance and its vicinity slightly increase, but the thickness of the deposit 66 on the side wall surface of the opening 65 gradually increases after the start of the processing to become 31 nm (opening width: 29 nm) 0.5 minute after the start of the processing and become 32 nm (opening width: 28 nm) about 1 minute after the start of the processing, and then slightly increases step by step to become 33 nm (opening width: 27 nm) about 3 minutes after the start of the processing.

Moreover, the antireflective film 63 and the SiON film 62 are etched over the opening width of 27 nm until the amorphous carbon film 61 as a lower layer resist film exposes itself.

The wafer Q in which the opening 65 has been reduced in opening width and whose antireflective film 63 and SiON film 62 have been etched as described above is transferred out from the chamber 22 of the process module 12 and transferred into the chamber of the process module 13 via the transfer module 11. Thereafter, as is the case with the first embodiment described above, the amorphous carbon film 61 is etched using the SiON film 62 as a hard mask so that a portion of the amorphous carbon film 61 which is not covered with the antireflective film 63 and SiON film 62, the photoresist film 64, and the deposit 66 accumulated on the opening 65 in the photoresist film 64 is etched, and the photoresist film 64, the deposit 66 accumulated on the opening in the photoresist film 64, and the antireflective film 63 are subjected to ashing, followed by terminating the present process.

An opening 65 with an opening width of 27 nm is formed in the amorphous carbon film 61. It should be noted that a wafer Q having the amorphous carbon film 61 with the opening 65 whose opening width has been shrunk is subjected separately to etching processing by a known method, so that the wafer Q with a target pattern and size is prepared.

According to the present embodiment, because the $CHF_3$ gas that tends to accumulate the deposit 66 on the side wall surface of the opening and the $CF_3I$ gas that is unlikely to diffuse laterally in the opening but suppresses accumulation of deposit on the bottom of the opening and tends to etch the underlayers are used in combination as the deposition gas, the opening width of the opening 65 in the photoresist film 64 can be reduced to fill the recent need for downsizing a semiconductor device, and the antireflective film 63 and the SiON film 62 in a portion that is not covered with the photoresist film 64 can be etched by plasma produced from the $CF_3I$ gas. That is, the shrinking step of reducing the opening width of the opening 65 and the etching step of etching the antireflective film 63 and SiON film 62 as intermediate layers can be carried out as a one-step approach. This improves the productivity of wafers Q.

In the present embodiment, the accumulation speed of the deposit 66 accumulating on the side wall surface of the opening 65 depends on the opening width W of the opening, and increases with increase in the opening width W of the opening 65 and decreases with decrease in the opening width W. The opening width W of the opening 65 after the attachment of deposit converges to a predetermined width in dependence on the gas attachment coefficient of the mixed gas of the deposition gas and the anisotropic etching gas as the processing time passes, and hence the opening width can be adjusted by adjusting the type, mixing ratio, etc. of gas to be used.

In the present embodiment, the deposition gas is represented by a general expression, $C_xH_yF_z$ (x, y, and z are integers including 0), and $CHF_3$ gas is suitably used. $CHF_3$ gas has a gas attachment coefficient S of about 0.5 and converges an opening width of, for example, 20 nm to 25 nm. This fills the recent need for downsizing a semiconductor device. Not only $CHF_3$ gas but also $CH_2F_2$ gas, $CH_3F$ gas, $C_5F_8$ gas, or $C_4F_6$ gas may be used as the deposition gas.

On the other hand, $CF_3I$ gas is suitably used as the anisotropic etching gas. $CF_3I$ gas is less poisonous than HBr gas and is thus easy to handle. Not only $CF_3I$ gas but also $CF_3Br$ gas, $CF_3At$ gas, HI gas, HBr gas, or the like may be used as the anisotropic etching gas. Moreover, sulfur (S) and an element with a higher molecular weight than sulfur (S) in the 16th group of the periodic system may be used in place of a halogen element in the anisotropic etching gas. Such gases containing a halogen element or an element in the 16th group of the periodic system have low volatility and are unlikely to diffuse laterally in the opening, and can punch the underlayers through etching without accumulating deposit on the bottom of the opening, and hence they may be used in combination with a deposition gas. It should be noted that because the anisotropic etching gas has low volatility, it reacts with carbon to produce a certain joint film to protect the side of the opening 65, and diffuses toward the bottom of the opening due to ion force to etch the intermediate films.

In the present embodiment, it is preferred that the mixing ratio of the deposition gas and the anisotropic etching gas is 6:1 to 1:1, and in particular, 4:3 to 3:2. If the flow rate of the anisotropic etching gas becomes higher than that of the deposition gas, it is difficult to obtain a sufficient shrinking effect. On the other hand, if the flow rate of the anisotropic etching gas is lower than 1/6 of the flow rate of the deposition gas, the antireflective film 63 and the SiON film 62 cannot be etched to a satisfactory level. It should be noted that in the present embodiment using the mixed gas of the deposition gas and the anisotropic etching gas, the amount of deposit attached to the side wall surface of the opening is slightly smaller than in the case that the deposition gas is used alone.

In the present embodiment, the bias electrical power during the etching processing is 100 W to 500 W. If the bias electrical power is less than 100 W, the bottom of the opening cannot be etched to a satisfactory level. On the other hand, the bias electrical power is more than 500 W, the photoresist film 64 becomes rough due to sputtering.

In the present embodiment, the pressure in the chamber during the etching processing is 2.6 Pa (20 mTorr) to 2×10 Pa (150 mTorr), preferably, 1×10 Pa (75 mTorr to 2×10 Pa (150 mTorr). If the processing pressure is too low, the surface of the substrate becomes rough. On the other hand, if the processing pressure is too high, the surface of the substrate is worn.

In the present embodiment, the temperature of the wafer Q during the etching processing is 20° C. to 100° C. although it is not particularly limited.

In the present embodiment, the intermediate layers that are etched at the same time when the opening width of the opening 65 in the photoresist film 64 is shrunk are the antireflective film 63 and the SiON film 62 as a silicon-containing film, but the silicon-containing film is not limited to the SiON film 62 but may be, for example, an $SiO_2$ film, an SiN film, an SiC film, an SiOC film, or an SiCN film. Moreover, the intermediate layers are not limited to an antireflective film and an SiON film, but may be, for example, a combination of an antireflective film and a metallic film such as a Ti film or a TiN film, or an Si-BARC film that is formed by adding several dozen % of silicon (Si) to BARC as an organic film and acts as an antireflective film.

Moreover, although the to-be-processed layer in the present embodiment is the lower layer resist layer 61, the to-be-processed layer is not limited to this, but may be, for example, an $SiO_2$ film or a TiN film.

In the present embodiment, the etching processing time is 0.5 minute to 3 minutes. If the etching processing time is shorter than 0.5 minute, it is difficult to obtain a satisfactory shrinking effect. On the other hand, if the etching processing time is longer than 3 minutes, no further effect can be obtained because the shrinking effect converges to complete the etching of the intermediate layers upon the lapse of an etching processing time of about 3 minutes.

In the present embodiment, the shrinking etching step of reducing the opening width of the opening 65 and etching the intermediate layers, and the etching step of etching the amorphous carbon film 61 may be successively carried out in the same chamber.

Examples 2 to 15 and

Comparative Examples 1 and 2

A wafer Q having the photoresist film 64 whose initial opening width is 60 nm, the antireflective film 63, and the SiON film 62 was subjected to the shrinking processing and the intermediate layer etching processing (one-step approach processing) using $CHF_3$ gas as a deposition gas and $CF_3I$ gas as an anisotropic etching gas at different pressures in the chamber, bias electrical powers, and gas flow ratios, and the surface of the photoresist film one minute after the start of the processing and the surface of the lower layer resist layer after the ashing processing were observed.

The conditions and the observation results are shown in Table 1 below.

TABLE 1

|  | Pressure (mT) | Bias electrical power (W) | Gas flow ratio | Observation result |
|---|---|---|---|---|
| Example 2 | 20 | 100 | 200/50 sccm | ○ |
| Example 3 | 20 | 300 | 150/100 sccm | ○ |
| Example 4 | 20 | 500 | 100/100 sccm | ○ |
| Example 5 | 75 | 100 | 150/100 sccm | ○ |
| Example 6 | 75 | 300 | 100/100 sccm | ○ |
| Example 7 | 75 | 500 | 200/50 sccm | ○ |
| Example 8 | 150 | 100 | 100/100 sccm | ○ |
| Example 9 | 150 | 300 | 200/50 sccm | ○ |
| Example 10 | 150 | 500 | 150/100 sccm | ○ |
| Example 11 | 75 | 300 | 210/40 sccm | ○ |
| Example 12 | 10 | 100 | 200/50 sccm | Δ |
| Example 13 | 75 | 300 | 200/250 sccm | Δ |
| Example 14 | 75 | 300 | 220/30 sccm | Δ |
| Comparative example 1 | 75 | 400 | 0/100 sccm | x |
| Comparative example 2 | 75 | 300 | 100/0 sccm | x |
| Example 15 | 75 | 1000 | 150/100 sccm | Δ |

Note)
Gas flow ratio = $CHF_3/CF_3I$
The observation result ○ indicates that an obtained wafer is satisfactory and practical.
The observation result Δ indicates that an obtained wafer has no serious defect and is practicable.
The observation result x indicates that the condition of a wafer is poor and cannot be applied to practical use.

The following things are clear from Table 1.

In the examples 2 to 11 in which the pressure in the chamber was 2.6 Pa (20 mTorr) to 2×10 Pa (150 mTorr), the bias electrical power was 100 W to 500 W, and the gas flow ratio ($CHF_3/CF_3I$) was 6:1 to 1:1, a satisfactory shrinking effect was obtained, and the etching effect of punching the antireflective film 63 and the SiON film 62 was also obtained.

Moreover, in the example 9, the opening widths that were 60 nm on average in an initial state could be shrunk to 25 nm on average. In this case, the average values of variations Δ changed from 13.9 nm to 3.7 nm.

In the example 12, although the surface of the photoresist film 64 became rough due to a low pressure in the chamber, but a wafer was practicable. Moreover, in the example 13, although a satisfactory shrinking effect was not obtained because the gas flow ratio was 4:5, a wafer was practicable. In the example 14, although a satisfactory intermediate layer etching effect was not obtained because the gas flow ratio was 7.3:1, a wafer was practicable.

In the comparative example 1, $CF_3I$ gas was used alone, and the intermediate layer etching effect was obtained in this case as well, but the shrinking amount was not sufficient. In the comparative example 2, because $CHF_3$ gas that is a deposition gas was used alone as a process gas, the shrinking effect was obtained, but the intermediate layers could not be punched because deposit became attached to the bottom of the opening.

In the example 15, the surface of the photoresist film 64 wore because the bias electrical power is too high, but a wafer could somehow be applied to practical use.

Example 16

A wafer Q having the photoresist film 64 whose initial opening width was 75 nm was subjected to the one-step approach processing using $CHF_3$ gas as a deposition gas and $CF_3I$ gas as an anisotropic etching gas on the conditions that the flow ratio of the $CHF_3$ gas to the $CF_3I$ gas was 4:1, the pressure in the chamber was 2×10 Pa (150 mTorr), the bias electrical power was 750+300 W, the temperature of the wafer Q was 60° C., and the shrinking amount and the etching states of the antireflective film 63 and the SiON film 62 were observed 30 seconds, 60 seconds, 120 seconds, 150 seconds, 180 seconds, and 300 seconds after the start of a test, and it was found that 30 seconds to 90 seconds after the start of the test, deposit (polymer) continuously accumulated on the side wall and the thickness of the deposit gradually increased while the antireflective film 63 was being punched. Moreover, until 90 seconds to 120 seconds after the start of the test, the shrinking further progressed, and etching of the SiON film 62 started. After that, 120 seconds to 180 seconds after start of the test, the SiON film 62 was completely punched, and the shrinking amount converged.

It is clear from this result that the processing time is preferably 0.5 minute to 3.0 minutes.

Next, a description will be given of a third embodiment of the present invention as a variation of the second embodiment. In the third embodiment, an opening width reducing step of using a mixed gas of an anisotropic etching gas and a hydrogen gas as a process gas and causing deposit to accumulate on a side wall surface of an opening 75 in a photoresist film 74, and an etching step of etching an antireflective film 73 and an SiON film 72 as intermediate layers forming a bottom of the opening 75 are carried out in one step (shrink etching step).

Figure 6A:
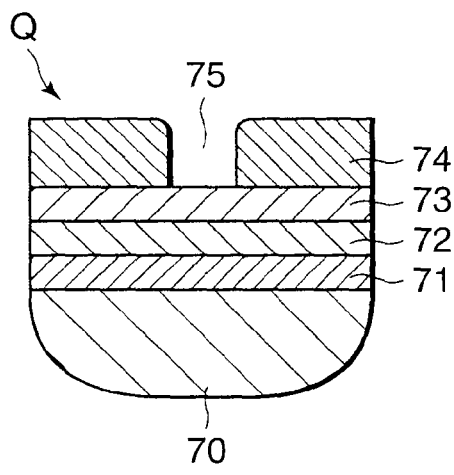
FIGS. 6A, 6B, and 6C are process diagrams of a substrate processing method according to a third embodiment of the present invention.
Figure 6B:
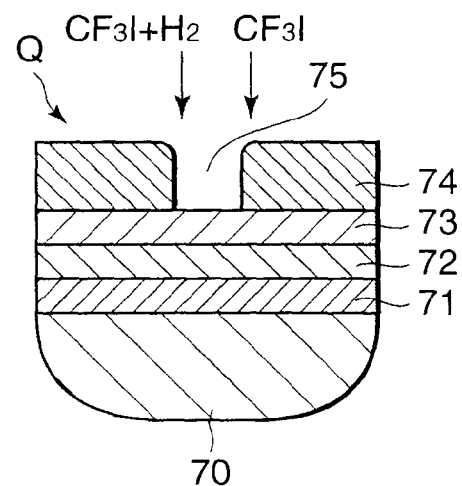
Figure 6C:
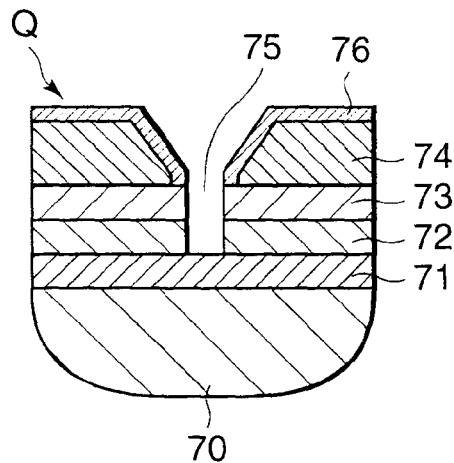

FIGS. 6A, 6B, and 6C are process diagrams of a substrate processing method according to the third embodiment of the present invention.

Referring to FIGS. 6A, 6B, and 6C, first, a wafer Q in which a lower layer resist film 71 made of amorphous carbon, the SiON film 72 as a hard mask, the antireflective film (BARC film) 73, and the photoresist film 74 are stacked in this order on a silicon base material 70, and the photoresist film 74 has an opening 75 to which part of the antireflective film 73 is exposed with an opening width of, for example, 60 nm is prepared (FIG. 6A). Then, the wafer Q is transferred into the chamber 22 of the process module 12 (see FIG. 2) and mounted on the mounting stage 23.

Next, the pressure in the chamber 22 is set to, for example, 1×10 Pa (75 mTorr) by the APC valve 26 or the like. Also, the temperature of the wafer Q is set to, for example, 40° C. Then, $CF_3I$ gas is supplied at a flow rate of, for example, 150 sccm from the upper layer gas supply unit 30 into the chamber 22, and $H_2$ gas is supplied at a flow rate of, for example, 100 sccm from the lower layer gas supply unit 29 of the showerhead 24 into the chamber 22. At this time, the flow ratio of the $CF_3I$ gas and the $H_2$ gas is 3:2. Then, radio frequency electrical power of 750 W as excitation electrical power and radio frequency electrical power of 300 W as bias electrical power are supplied to the mounting stage 23. Also, a DC voltage of 50 V is applied to the showerhead 24.

At this time, part of the $CF_3I$ gas and the $H_2$ gas react with each other, and F components of the $CF_3I$ gas are pulled out as HF, and part of the $CF_3I$ gas acts as a deposition gas because F components are relatively decreased. That is, a gas produced from the reaction of the $CF_3I$ gas and the $H_2$ gas (hereinafter referred to as the "$CF_3I$ gas/$H_2$ gas reaction produced gas") and unreacted $CF_3I$ gas turn into plasma due to radio frequency electrical power applied into the processing space R, so that ions and radicals are produced (FIG. 6B). The ions and radicals produced from the $CF_3I$ gas/$H_2$ gas reaction produced gas collide and react with a surface of the photoresist film 74 or a side wall surface of the opening 75 in the photoresist film 74, causing deposit 76 to accumulate on that portion to reduce the opening width. At this time, the deposit 76 tends to accumulate on a bottom of the opening 75 as well. On the other hand, the ions and radicals produced from the unreacted $CF_3I$ gas are unlikely to laterally diffuse in the opening 75, and slightly etch a peripheral portion of the opening 75 to form a tapered wall surface and go toward the bottom of the opening 75 to collide with the deposit accumulated on the bottom of the opening 75 and remove the deposit and further etch the antireflective film 73 and the SiON film 72 as underlayers. Thus, the ions and radicals produced from the $CF_3I$ gas/$H_2$ gas reaction produced gas collaborate with the ions and radicals produced from the unreacted $CF_3I$ gas to etch the antireflective film 73 and the SiON film 72 at the bottom of the opening 75 which is not covered with the photoresist film 74 and the deposit 76 accumulated on the photoresist film 74 while shrinking the opening width of the opening 75 (FIG. 6C).

At this time, the thickness of the deposit 76 on the side wall surface of the opening 75 gradually increases from the start of the processing, and 150 seconds after the start of the processing, the total thickness of the deposit 76 on both side wall surfaces of the opening 75 is 29 nm (opening width: 31 nm). Moreover, the antireflective film 73 and the SiON film 72 are etched over the opening width of 31 nm until the amorphous carbon film 71 as a lower layer resist film exposes itself, and the amorphous carbon film 71 exposes itself correspondingly to the opening width of the opening 75.

The wafer Q in which the opening 75 has been reduced in opening width and whose antireflective film 73 and SiON film 72 had been etched as described above is transferred out from the chamber 22 of the process module 12, and transferred into the chamber of the process module 13 via the transfer module 11. Thereafter, as is the case with the second embodiment described above, the amorphous carbon film 71 is etched using the SiON film 72 as a hard mask so that a portion of the amorphous carbon film 71 which is not covered with the antireflective film 73 and SiON film 72, the photoresist film 74, and the deposit 76 accumulated on the opening 75 in the photoresist film 74 is etched and subjected to ashing processing, followed by terminating the present process.

An opening with corresponding to the 31 nm opening width of the opening 75 is formed in the amorphous carbon film 71. It should be noted that the wafer Q having the amorphous carbon film 71 with the opening 75 whose opening width has been shrunk is separately subjected to etching processing by a known method, so that the wafer Q with a target pattern and size is prepared.

According to the present embodiment, because the shrinking step of shrinking the opening width of the opening 75 and the etching step of etching the antireflective film 73 and the SiON film 72 as intermediate layers are carried out as a one-step approach (shrinking etching step), as is the case with the second embodiment described above, the recent need for downsizing a semiconductor device can be filled, and the productivity of wafers Q can be improved.

According to the present embodiment, because the mixed gas of the $CF_3I$ gas as an anisotropic etching gas and the $H_2$ gas is used as a process gas, and the flow ratio of the $CF_3I$ gas and the $H_2$ gas is 3:2, part of the $CF_3I$ gas and the $H_2$ gas react with each other, and F components are pulled out as HF from part of the $CF_3I$ gas, whereby the $CF_3I$ gas/$H_2$ gas reaction produced gas is obtained. The $CF_3I$ gas/$H_2$ gas reaction produced gas is a gas in which the percentage of F components has decreased relatively and the percentage of C components has increased relatively compared with the $CF_3I$ gas, and acts as a deposition gas. Specifically, the $CF_3I$ gas is an anisotropic etching gas containing a high percentage of F components, and hence cannot exert a deposition effect, but by adding the $H_2$ gas to the $CF_3I$ gas and pulling out F components as HF, C components are increased relatively, so that the $CF_3I$ gas can exert a deposit accumulating function. As described above, the shrinking step of reducing the opening width of the opening 75 by using the $CF_3I$ gas/$H_2$ gas reaction produced gas that tends to accumulate the deposit 76 on the side wall surface of the opening and the unreacted $CF_3I$ gas that is unlikely to diffuse laterally in the opening but suppresses accumulation of deposit on the bottom of the opening and tends to etch the underlayers, and the etching step of etching the antireflective film 73 and the SiON film 72 as intermediate films can be carried out as a one-step approach (shrinking etching step). It should be noted that HF gas produced when F components are pulled out from the $CF_3I$ gas through the reaction of the $CF_3I$ gas and the $H_2$ gas is discharged from the system, and thus does not become attached to component members in the chamber and does not cause any troubles.

In the present embodiment, the anisotropic etching gas is a gas containing boron (Br) or a halogen element of a higher atomic number than boron (Br), carbon, and fluorine, and in particular, $CF_3I$ gas or $CF_3Br$ gas is suitably used. $CF_3I$ gas and $CF_3Br$ gas/$H_2$ gas have lower global warming potentials (GWP) as compared with $CFH_3$ gas/$CF_4$ gas that has been conventionally used. Thus, according to the present embodiment, environmental burdens can significantly be reduced as compared with the prior art in which a mixed gas of $CFH_3$ gas and $CF_4$ gas is used as a process gas.

In the present embodiment, it is preferred that the mixing ratio of the anisotropic etching gas and the $H_2$ gas is 4:1 to 2:3, and in particular, 2:1 to 4:3. If the flow rate of the $H_2$ gas is lower than 1/4 of the flow rate of the anisotropic etching gas, it is difficult to obtain a satisfactory shrinking effect because the $CF_3I$ gas/$H_2$ gas reaction produced gas acting as a deposition gas runs short. On the other hand, if the flow rate of the $H_2$ gas is higher than 3/2 of the flow rate of the anisotropic etching gas, the antireflective film 73 and the SiON film 72 cannot be etched to a satisfactory level because the amount of unreacted anisotropic etching gas that does not react with the $H_2$ gas runs short. It should be noted that an optimum mixing ratio of the anisotropic etching gas and the $H_2$ gas depends on the processing pressure or the like.

In the present embodiment, the bias electrical power during the etching processing is 100 W to 500 W. If the bias electrical power is less than 100 W, the bottom of the opening cannot be etched to a satisfactory level. On the other hand, if the bias electrical power is more than 500 W, the photoresist film 74 becomes rough due to sputtering.

In the present embodiment, the pressure in the chamber during the etching processing is 2.6 Pa (20 mTorr) to 2×10 Pa (150 mTorr), preferably, 1×10 Pa (75 mTorr to 2×10 Pa (150mTorr)). If the processing pressure is too low, the surface of the substrate becomes rough. On the other hand, if the processing pressure is too high, the surface of the substrate is worn. It should be noted that the temperature of the wafer Q during the etching processing is 20° C. to 100° C. although it is not particularly limited.

In the present embodiment, the intermediate layers are the antireflective film 73 and the SiON film 72 as a silicon-containing film, but the silicon-containing film is not limited to the SiON film 72 but may be, for example, an $SiO_2$ film, an SiN film, an SiC film, an SiOC film, or an SiCN film. Moreover, the intermediate layers are not limited to an antireflective film and a silicon-containing film, but may be, for example, a combination of an antireflective film and a metallic film such as a Ti film or a TiN film, or an Si-BARC film that is formed by adding several dozen % of silicon (Si) to BARC as an organic film and acts as an antireflective film.

Moreover, although in the present embodiment, the to-be-processed layer is the lower layer resist layer 71, the to-be-processed layer is not limited to this, but may be, for example, an $SiO_2$ film or a TiN film.

In the present embodiment, the etching processing time is 0.5 minute to 3 minutes. If the etching processing time is shorter than 0.5 minute, it is difficult to obtain a satisfactory shrinking effect. If the etching processing time is equal to or longer than 3 minutes, no further effect can be obtained because shrinking effect converges to complete the etching of the intermediate layers upon the lapse of an etching processing time of about 3 minutes.

In the present embodiment, the shrinking etching step of reducing the opening width of the opening 75 and etching the intermediate layers, and the etching step of etching the amorphous carbon film 71 may be successively carried out in the same chamber.

Examples 17 to 19 and

Comparative Examples 3 to 7

A wafer Q having the photoresist film 74 whose initial opening width is 60 nm, the antireflective film 73, and the SiON film 72 was subjected to the shrink etching processing using a mixed gas of $CF_3I$ gas and $H_2$ gas as a process gas at different pressures in the chamber, bias electrical powers, gas flow ratios, and processing times, and the surface of the photoresist film after the processing and the surface of the lower layer resist layer after the ashing processing were observed.

The conditions and the observation results are shown in Table 2 below.

TABLE 2

| | Pressure (mT) | Bias electrical power (W) | Gas flow ratio (sccm) | | Processing time (sec) | Observation result |
|---|---|---|---|---|---|---|
| | | | $CF_3I$ gas/$H_2$ gas | $CF_4$/ $CHF_3$ | | |
| Example 17 | 75 | 300 | 200/50 | — | 60 | ○ |
| Example 18 | 75 | 300 | 150/100 | — | 120 | ○ |
| Example 19 | 75 | 300 | 100/150 | — | 150 | ○ |
| Comparative example 3 | 75 | 300 | 250/0 | — | 60 | x |
| Comparative example 4 | 75 | 300 | — | 250/0 | 50 | x |
| Comparative example 5 | 75 | 300 | — | 125/125 | 90 | x |
| Comparative example 6 | 75 | 300 | — | 100/150 | 90 | x |
| Comparative example 7 | 75 | 300 | — | 50/200 | 120 | |

The observation result ○ indicates that a obtained wafer can is good and practical.
The observation result Δ indicates that an obtained wafer has no serious defect and is practicable.
The observation result x indicates that the condition of a wafer is poor and cannot be applied to practical use.

The following things are clear from Table 2.

In the examples 17 to 19, because the flow ratio of $CF_3I$ gas as an anisotropic etching gas and $H_2$ gas was 4:1 to 2:3, the pressure in the chamber was 1×10 Pa (75 mTorr), the bias electrical power was 300 W, and the processing times were 60 seconds, 120 seconds, and 150 seconds, respectively, and thus each of the conditions was inside the scope of the present invention, a satisfactory shrinking effect was obtained, and the etching effect of punching the intermediate layers consisting of the antireflective film 73 and the SiON film 72 as intermediate layers was also obtained. It should be noted that in the example 18, the opening widths of the openings 75 that were 60 nm on average in an initial state could be shrunk to 31 nm on average, and variations in hole diameter were extremely small.

In the comparative example 3, $CF_3I$ gas was used alone, and the intermediate layer etching effect was obtained in this case as well, but a satisfactory shrinking effect was not obtained because the $CF_3I$ gas alone was not a process gas defined in the present invention. Moreover, in the comparative example 4, $CF_4$ gas that was an anisotropic etching gas was used alone as a process gas, and the intermediate layers could be punched, but the shrinking effect was not obtained because $CF_4$ gas alone was not a process gas defined in the present invention.

In the comparative examples 5 to 7, a mixed gas of $CF_4$ gas and $CHF_3$ gas was used as a process gas, and the shrinking effect increased as the ratio of the flow rate of $CHF_3$ gas to the flow rate of $CF_4$ gas increased, but because the mixed gas of $CF_4$ gas and $CHF_3$ gas was not a process gas defined in the present invention, the top of an opening became rough, and variations in hole diameter were large, and hence wafers were not suitable for practical use.

Although in the above described embodiments, the substrates subjected to the plasma processing are not limited to wafers for semiconductor devices, and rather may instead be any of various substrates used in FPDs (flat panel displays) including LCDs (liquid crystal displays), photomasks, CD substrates, print substrates, or the like.

It is to be understood that the object of the present invention may also be accomplished by supplying a system or an apparatus with a storage medium in which a program code of software, which realizes the functions of any of the above described embodiments is stored, and causing a computer (or a CPU, an MPU, or the like) of the system or the apparatus to read out and execute the program code stored in the storage medium.

In this case, the program code itself read from the storage medium realizes the functions of any of the above described embodiments, and hence the program code and the storage medium on which the program code is stored constitute the present invention.

Examples of the storage medium for supplying the program code include a medium capable of storing the above program code, for example, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a non-volatile memory card, and a ROM. Alternatively, the program code may be supplied by downloading via a network.

Further, it is to be understood that the functions of any of the above described embodiments may be accomplished not only by executing a program code read out by a computer, but also by causing an OS (an operating system) or the like which operates on a computer to perform a part or all of the actual operations based on instructions of the program code.

Further, it is to be understood that the functions of any of the above described embodiments may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

What is claimed is:

1. A substrate processing method that processes a substrate in which a to-be-processed layer, an intermediate layer, and a mask layer are stacked in this order, and in which the mask layer has an opening to which part of the intermediate layer is exposed, comprising:
    an opening width reducing step comprising accumulating deposit on a side wall surface of the opening in the mask layer using plasma produced from a deposition gas alone having a gas attachment coefficient S of 0.1 to 1.0, thus reducing an opening width of the opening, and
    an intermediate layer etching step of transferring the opening, the opening width of which is reduced in said opening width reducing step, onto the intermediate layer using plasma produced from a mixed gas comprising the deposition gas and an etching gas,
    wherein in said intermediate layer etching step, no bias electric power is applied to the substrate.

2. A substrate processing method as claimed in claim 1, wherein the deposition gas is represented by a general expression, $C_xH_yF_z$ (x, y, and z are 0 or positive integers).

3. A substrate processing method as claimed in claim 2, wherein the deposition gas is $CHF_3$ gas.

4. A substrate processing method as claimed in claim 1, wherein in said opening width reducing step, bias electrical power of 100 W to 500 W is applied to the substrate.

5. A substrate processing method as claimed in claim 1, wherein a processing time in said opening width reducing step is 0.5 minute to 3 minutes.

6. A substrate processing method as claimed in claim 1, wherein said opening width reducing step comprises converging the opening width of the opening in the mask layer to a predetermined value corresponding to a value of the gas attachment coefficient S of the deposition gas.

7. A substrate processing method as claimed in claim 1, wherein said opening width reducing step comprises reducing the opening width of the opening in the mask layer, and smoothing out variations in the opening widths of the openings formed in the mask layer to reduce deviations.

8. A substrate processing method as claimed in claim 1, further comprising:
  a to-be-processed layer etching step of transferring the opening transferred to the intermediate layer in said intermediate layer etching step onto the to-be-processed layer using plasma produced from a non-deposition gas.

9. A substrate processing method as claimed in claim 1, wherein in said opening width reducing step, the side wall of the opening is made to be tapered.

\* \* \* \* \*